(12) United States Patent
Li et al.

(10) Patent No.: US 9,761,680 B2
(45) Date of Patent: Sep. 12, 2017

(54) SEMICONDUCTOR DEVICE WITH EMBEDDED NON-VOLATILE MEMORY AND METHOD OF FABRICATING SEMICONDUCTOR DEVICE

(71) Applicant: UNITED MICROELECTRONICS CORP., Hsin-Chu (TW)

(72) Inventors: Dongdong Li, Singapore (SG); Ko-Chi Chen, Taoyuan (TW); Shen-De Wang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/923,409

(22) Filed: Oct. 26, 2015

(65) Prior Publication Data

US 2017/0117372 A1  Apr. 27, 2017

(51) Int. Cl.
| | |
|---|---|
| H01L 29/788 | (2006.01) |
| H01L 29/423 | (2006.01) |
| H01L 27/11534 | (2017.01) |
| H01L 29/66 | (2006.01) |

(52) U.S. Cl.
CPC .. H01L 29/42328 (2013.01); H01L 27/11534 (2013.01); H01L 29/42336 (2013.01); H01L 29/66825 (2013.01)

(58) Field of Classification Search
CPC ......... H01L 27/11534; H01L 29/42328; H01L 29/66825; H01L 29/7881
USPC .............. 257/315–317, 319–320, 324, 326
See application file for complete search history.

(56) References Cited

U.S. PATENT DOCUMENTS

| | | | | |
|---|---|---|---|---|
| 5,705,415 | A * | 1/1998 | Orlowski | H01L 27/11556 257/E21.693 |
| 6,051,465 | A * | 4/2000 | Kato | H01L 29/66825 257/E21.422 |
| 6,380,585 | B1 * | 4/2002 | Odanaka | H01L 29/42324 257/315 |
| 8,518,775 | B2 | 8/2013 | Liu | |
| 2003/0173616 | A1 * | 9/2003 | Kusumi | H01L 21/28273 257/316 |
| 2013/0087849 | A1 | 4/2013 | Meotto | |
| 2014/0307511 | A1 * | 10/2014 | Do | H01L 29/66825 365/185.27 |

OTHER PUBLICATIONS

Yu, Title of Invention: Semiconductor Device and Method of Forming the Same, U.S. Appl. No. 14/863,177, filed Sep. 23, 2015.
Hsu, Title of Invention: Semiconductor Device and Method of Fabricating Semiconductor Device, U.S. Appl. No. 14/856,577, filed Sep. 17, 2015.

* cited by examiner

Primary Examiner — Hung Vu
(74) Attorney, Agent, or Firm — Winston Hsu (57) ABSTRACT

The present invention provides a semiconductor device, including a substrate with a memory region and a logic region, the substrate having a recess disposed in the memory region, a logic gate stack disposed in the logic region, and a non-volatile memory disposed in the recess. The non-volatile memory includes at least two floating gates and at least two control gates disposed on the floating gates, where each floating gate has a step-shaped bottom, and the step-shaped bottom includes a first bottom surface and a second bottom surface lower than the first bottom surface.

10 Claims, 10 Drawing Sheets

SEMICONDUCTOR DEVICE WITH EMBEDDED NON-VOLATILE MEMORY AND METHOD OF FABRICATING SEMICONDUCTOR DEVICE

BACKGROUND OF THE INVENTION

1. Field of the Invention

The present invention relates to a semiconductor device and a method of fabricating semiconductor device, more particularly, to a semiconductor device with non-volatile memory and logic transistor and fabricating method thereof.

2. Description of the Prior Art

A typical NVM (non-volatile memory) integration circuit generally has structure including a non-volatile gate stack along with logic gate stacks. Recently, a high dielectric constant metal gate (HKMG) scheme has been developed for the logic gate stacks. In a conventional replacement metal gate process of the HKMG scheme, at least two chemical mechanical polishing (CMP) steps are utilized, wherein the first CMP step is performed prior to removing dummy polysilicon gate stacks and the second CMP step is performed after the deposition of the metal gate stacks is complete. These two CMP steps require that the upper surfaces of the gate stacks be coplanar. However, in consideration of applying the HKMG scheme to the NVM integration circuit, the gate stack of the usual NVM cell is taller than the logic gate stacks, thus the formation of NVM cell is incompatible with the HKMG scheme.

SUMMARY OF THE INVENTION

The present invention provides a semiconductor device, including a substrate with a memory region and a logic region, the substrate having a recess disposed in the memory region, a logic gate stack disposed in the logic region, and a non-volatile memory disposed in the recess, the non-volatile memory comprising at least two floating gates and at least two control gates disposed on the floating gates, wherein each floating gate has a step-shaped bottom, and the step-shaped bottom includes a first bottom surface and a second bottom surface lower than the first bottom surface.

The present invention further provides method for forming a semiconductor device, comprising: a substrate with a memory region and a logic region is provided, a recess is formed in the substrate within the memory region, a non-volatile memory is formed in the recess. The non-volatile memory comprises at least two floating gates and at least two control gates disposed on the floating gates, wherein each floating gate has a step-shaped bottom, and the step-shaped bottom includes a first bottom surface and a second bottom surface lower than the first bottom surface, and a logic gate stack is formed in the logic region.

In summary, the key feature of the present invention is forming the NVM device embedded in the substrate, and the height of the NVM device is lower than the height of the adjacent gate stack. In conventional process, the height of the NVM device is much taller than the height of the adjacent gate stack, so the height of the total semiconductor device is thick. But in the present invention, since the NVM device is embedded in the substrate, the height of the total semiconductor device can be decreased. Another feature of the present invention is the floating gate of the NVM device has a step-shaped bottom and a "Z" shaped profile. Therefore, each floating gate has a sharp corner that is disposed under the erase gate and directly contacts it. In this way, while the erasing operation of the NVM is performed, the charges that stored in the floating gate can be discharged easily through the sharp corner to the erase gate, thereby improving the erasing efficiency (erase speed) of NVM.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
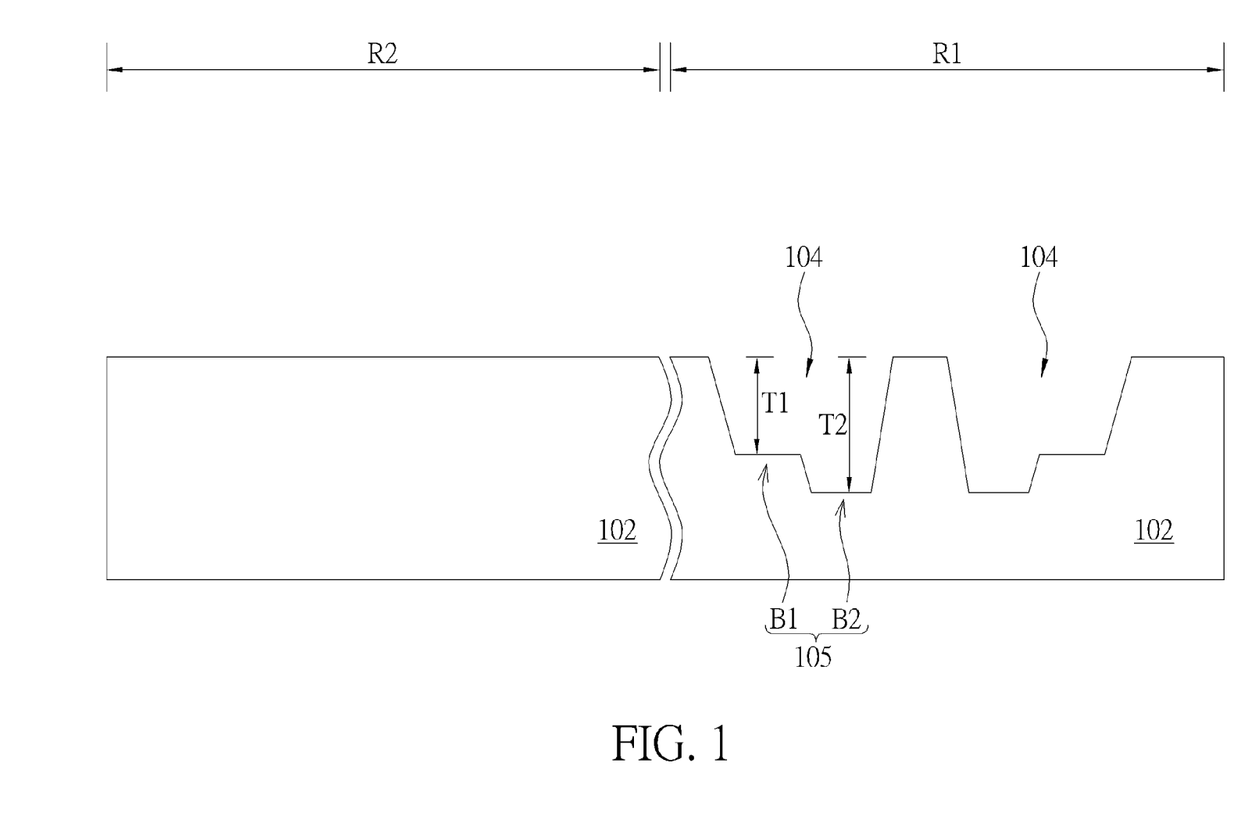
FIG. 1 to FIG. 10 are schematic diagrams illustrating manufacturing process according to a first embodiment of the method for fabricating semiconductor device of the present invention.

Please refer to FIG. 1 to FIG. 10. FIG. 1 to FIG. 10 are schematic diagrams illustrating manufacturing process according to a first embodiment of the method for fabricating semiconductor device of the present invention. As shown in FIG. 1, a substrate 102 is first provided. A memory region R1 and a logic region R2 are defined on the substrate, wherein at least one NVM cell and at least one logic transistor are predetermined to be formed in the memory region R1 and the logic region R2 respectively. The substrate 102 may be a semiconductor substrate (such as a silicon substrate), a silicon containing substrate (such as a silicon carbide substrate), an III-V group-on-silicon (such as GaN-on-silicon) substrate, a graphene-on-silicon substrate or an epitaxial layer containing substrate, but is not limited thereto. Then, a recess 104 is formed by performing an etching process on the memory region R1. It is noteworthy that the recess 104 has a step-shaped bottom 105, and the step-shaped bottom 105 includes a first bottom surface B1 and a second bottom surface B2 lower than the first bottom surface B1. The recess 104 has a first depth T1 corresponding to the first bottom surface B1 between 1200 and 2200 angstroms, and has a second depth T2 corresponding to the second bottom surface B2 between 1500 and 2500 angstroms, but is not limited thereto. The formation of the recess 104 may include a double patterning process, for example, depositing an etching mask layer (not shown) on the substrate 102, patterning the etching mask layer to remove a portion of the etching mask layer disposed in the memory region R1, performing an etching process to remove a portion of the substrate 102 exposed by the patterned etching mask layer, so as to form the recesses with the first bottom surface B1, and removing the patterned etching mask layer. Afterwards, the process mentioned above is repeated, so as to form the recesses with the first bottom surface B2. However, the method for forming the recesses 104 is not limited thereto. The recesses 104 can be formed through other processes such as adjusting the thickness of the etching mask layer, and forming the recesses 104 in only once etching process should also be within the scope of the present invention.

Figure 2:
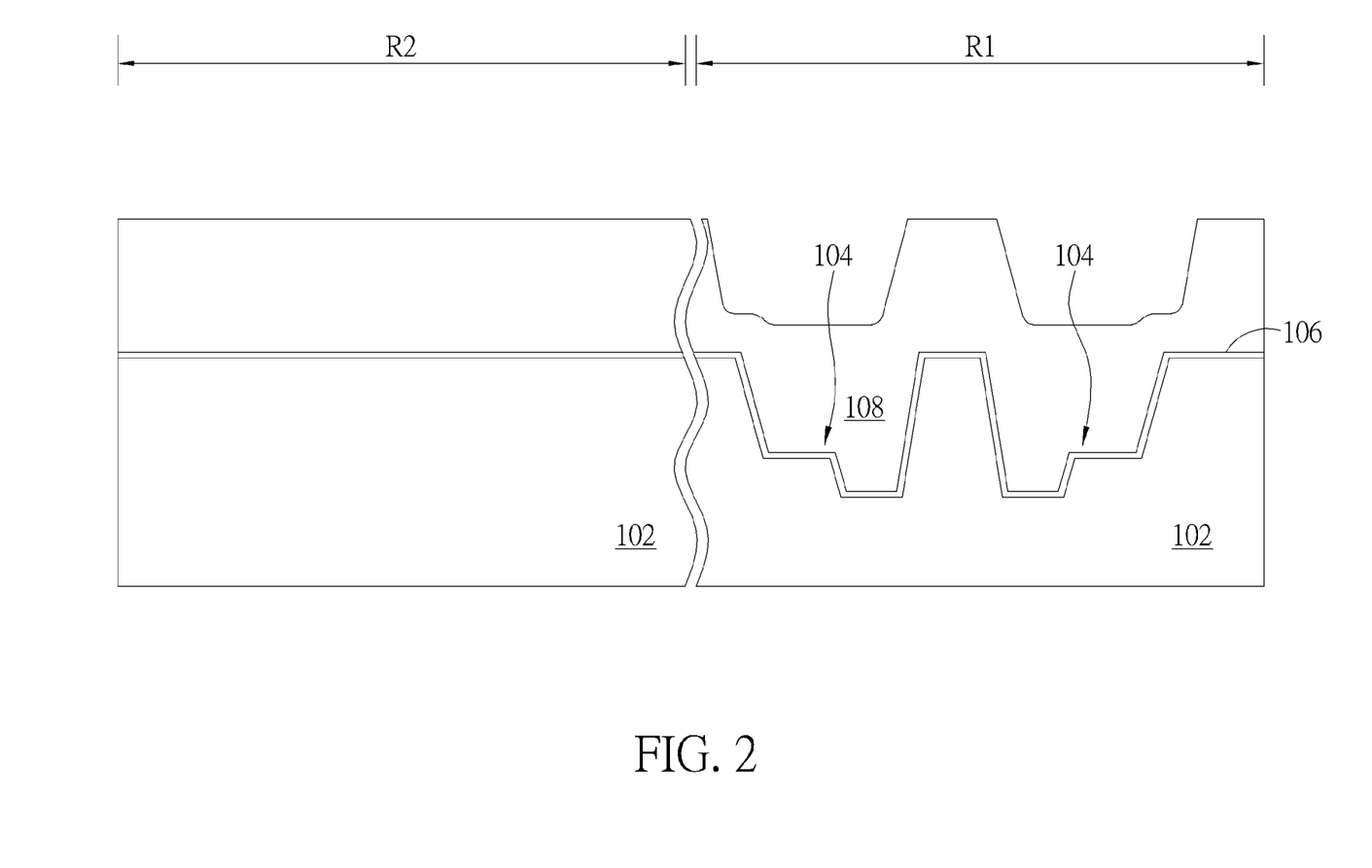

Then, as shown in FIG. 2, a tunnel layer 106 is formed on the top surface of the substrate 102 and the step-shaped bottom surface 105 of the recess 104. For example, the tunnel layer 106 is an oxide layer and may be formed through a thermal process, but is not limited thereto. Sequentially, a first polysilicon layer 108 is blanketly deposited on the substrate 102, covering the top surface of the substrate 102 and filling the recess 104. The first polysilicon layer 108 may have a thickness ranging from about 1500 to about 4500 angstroms, but is not limited thereto.

Figure 3:
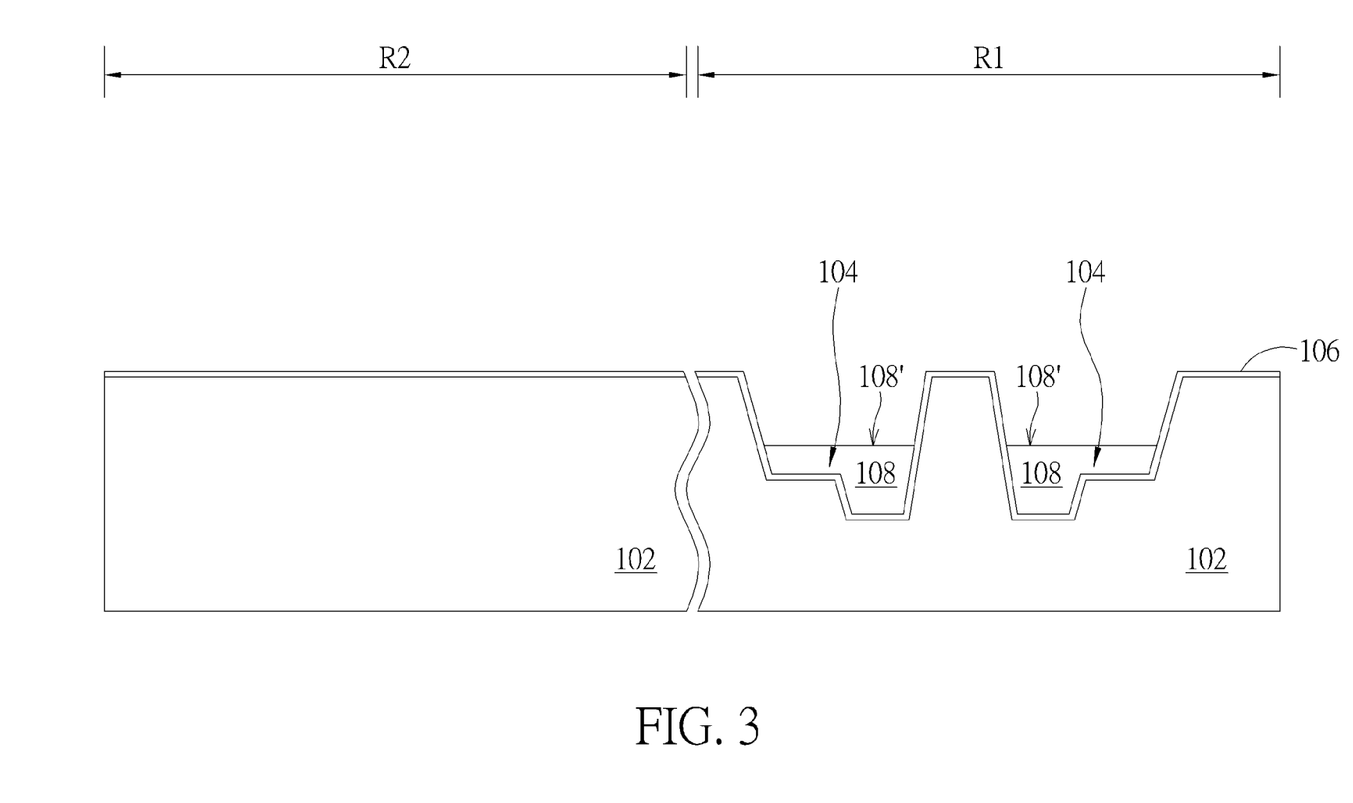

Referring to FIG. 3, a portion of the first polysilicon layer 108 is then removed. As an example, a CMP process may be first carried out to remove the polysilicon material positioned above the top surface of the substrate 102, and then an etching back process is further performed to remove the upper portion of the remaining polysilicon material in the recess 104. Therefore, the top surface of the remaining first polysilicon layer 108' is lower than the top surface of the substrate 102.

Figure 4:
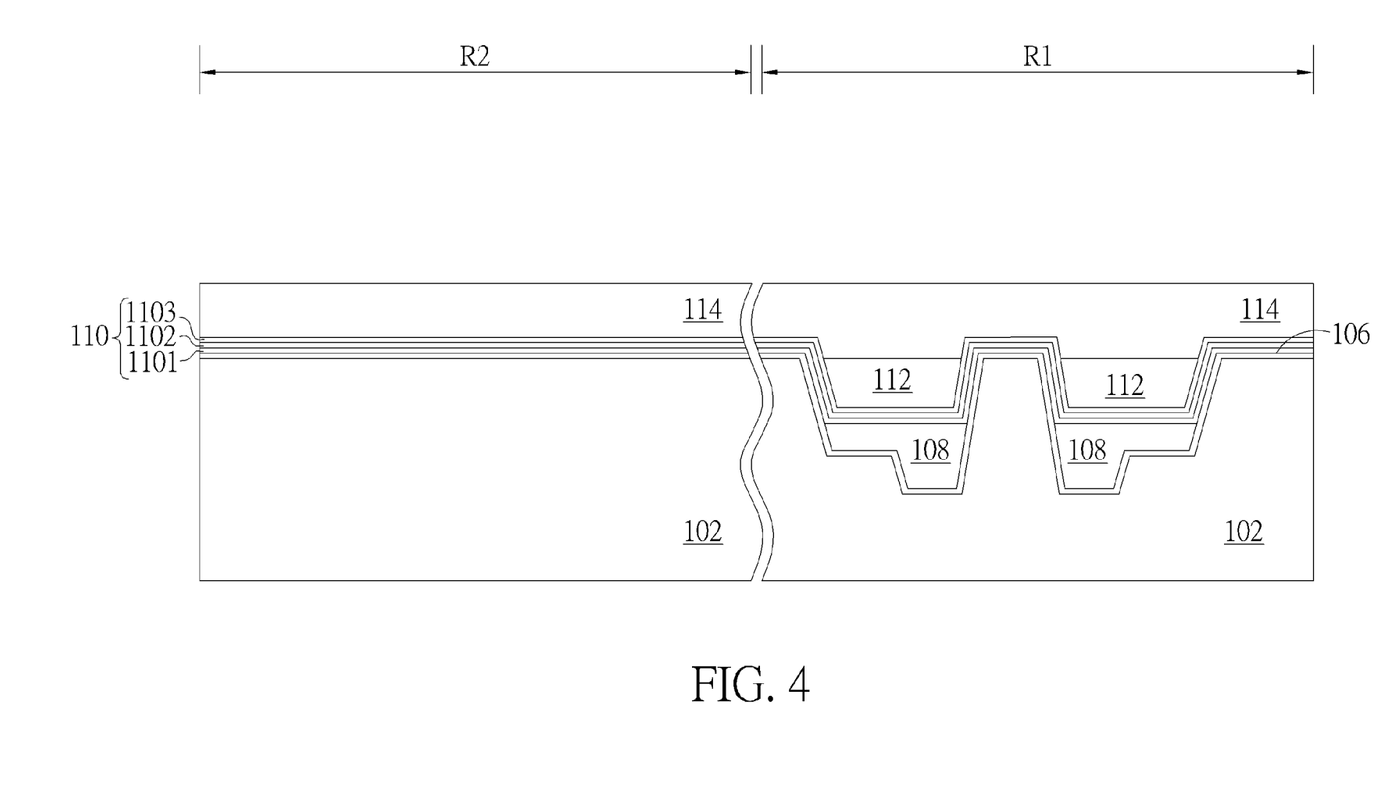

Referring to FIG. 4, a dielectric layer 110 and a second polysilicon layer 112 are successively deposited on the substrate 102 to fill the recess 104, wherein the dielectric layer 110 is preferably a stack layer including an oxide layer 1101, a nitride layer 1102, and an oxide layer 1103 from bottom to top, called an oxide-nitride-oxide (ONO) stack-layer. Thereafter, an etching back process is sequentially carried out to remove a portion of the second polysilicon layer 112 and a portion of the dielectric layer 110. During this etching process, the second polysilicon layer 112 in the logic region R2 is removed, and the tunnel layer 106 and the dielectric layer 110 can also be removed, or it can be removed in the following steps. In this embodiment, the dielectric layer 110 is still remaining on the substrate 102 within the logic region R2. Next, a hard mask layer 114 is then formed, covering the dielectric layer 110 and the second polysilicon layer 112. The hard mask layer 114 can be a silicon nitride layer, but is not limited thereto.

Figure 5:
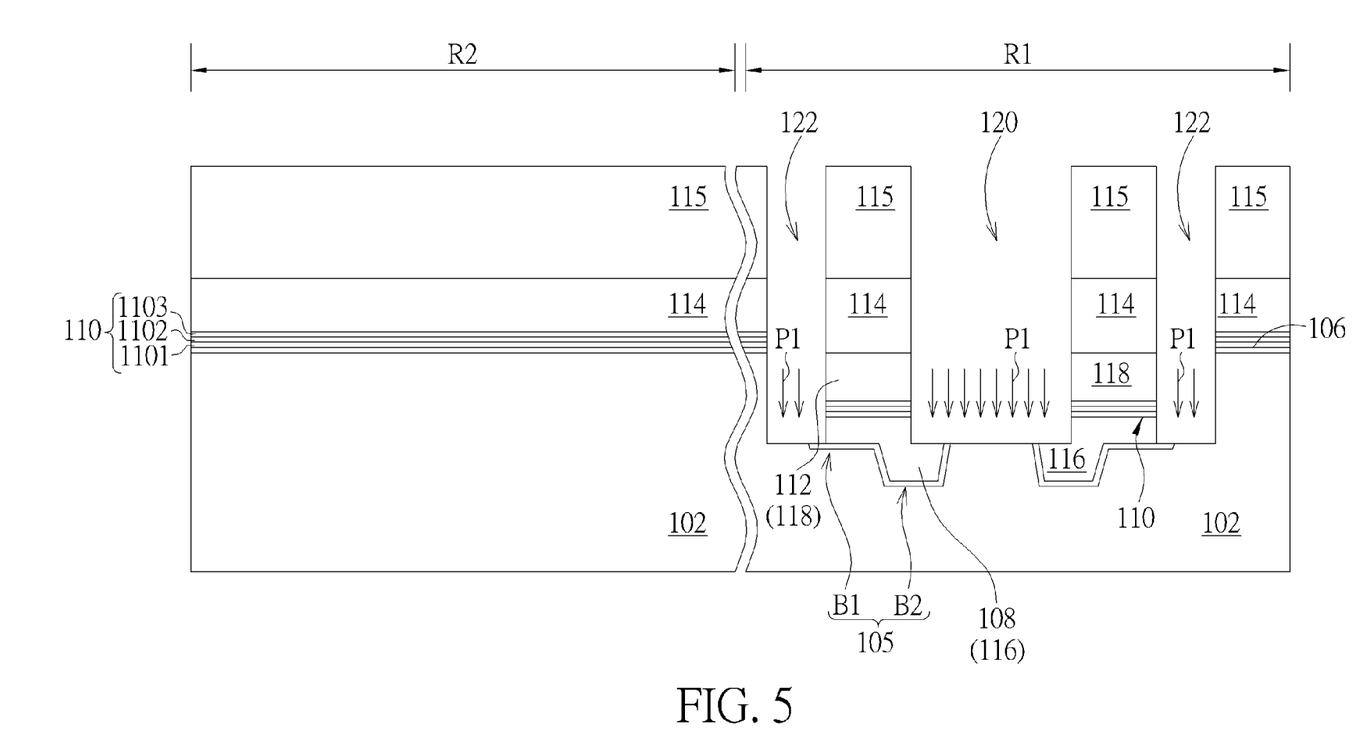

Next, as shown in FIG. 5, a patterned photoresist layer 115 is formed on the hard mask layer 114, and an etching process P1 is then performed to remove portions of the hard mask layer 114, the second polysilicon layer 112, the dielectric layer 110, the first polysilicon layer 108, the tunnel layer 106 and the substrate 102 by taking the patterned photoresist as an etching mask. After the etching process P1 is performed, the remaining first polysilicon layer 108 forms at least one floating gate 116, and the remaining second polysilicon layer 112 forms at least one control gate 118 covering the floating gate 116. In addition, at least one first trench 120 and at least two second trenches 122 are formed after the etching process P1, where the first trench 120 is disposed between two floating gates 116, and parts of the floating gate 116 are disposed under the first trench 120. It is noteworthy that since the recesses 104 mentioned above have a step-shaped bottom 105, after the first polysilicon layer 108 is partially removed and the floating gates 116 are formed, each floating gate 116 will have a "Z" shape profile, including the step-shaped bottom 105, and the step-shaped bottom 105 includes the first bottom surface B1 and the second bottom surface B2 lower than the first bottom surface B1.

Figure 6:
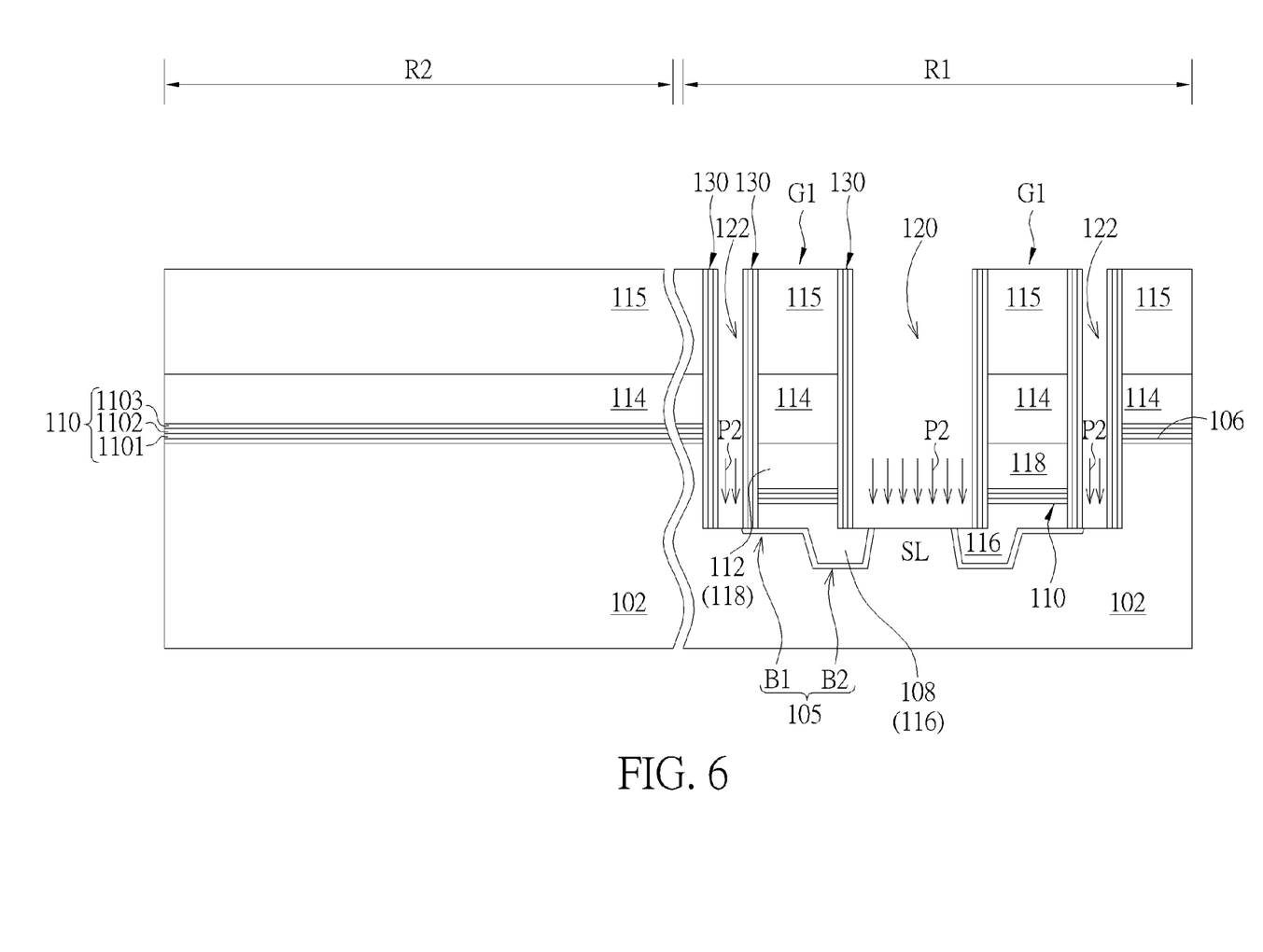

Please refer to FIG. 6, the patterned photoresist layer 115 is removed. Accordingly, at least one non-volatile gate stack G1 of NVM cell is formed, the non-volatile gate stack G1 at least including the control gate 118, the dielectric layer 110, and the floating gate 116, are fabricated in sequence. Then, a spacer 130 is deposited on the substrate 102 blanketly to cover the sidewall of each non-volatile gate stack G1. The spacer 130 may be a single layer structure or a multiple layer structure. For example, in this embodiment, the spacer 130 includes oxide-nitride-oxide (ONO) stack-layer, but is not limited thereto. The spacer 130 provides protection effect to the floating gates 116 and the control gates 118 for avoiding damage from following fabrication processes of the logic gate stack.

Besides, an ion implant process P2 may be carried out to form light diffusion drain (LDD) areas (not shown), and to form the source lines SL in the substrate 102, near the non-volatile gate stack G1. Following that, an epitaxial layer (not shown) including silicon-germanium (SiGe) for example may be selectively formed on the surface of the substrate 102. In this embodiment, the ion implant process P2 is performed during the process for forming the spacer 130. More precisely, an oxide layer and a nitride layer of the spacer 130 is firstly formed, and the ion implant process P2 is then performed. Afterwards, the rest oxide layer of the spacer 130 is formed. However, the present invention is not limited thereto.

Figure 7:
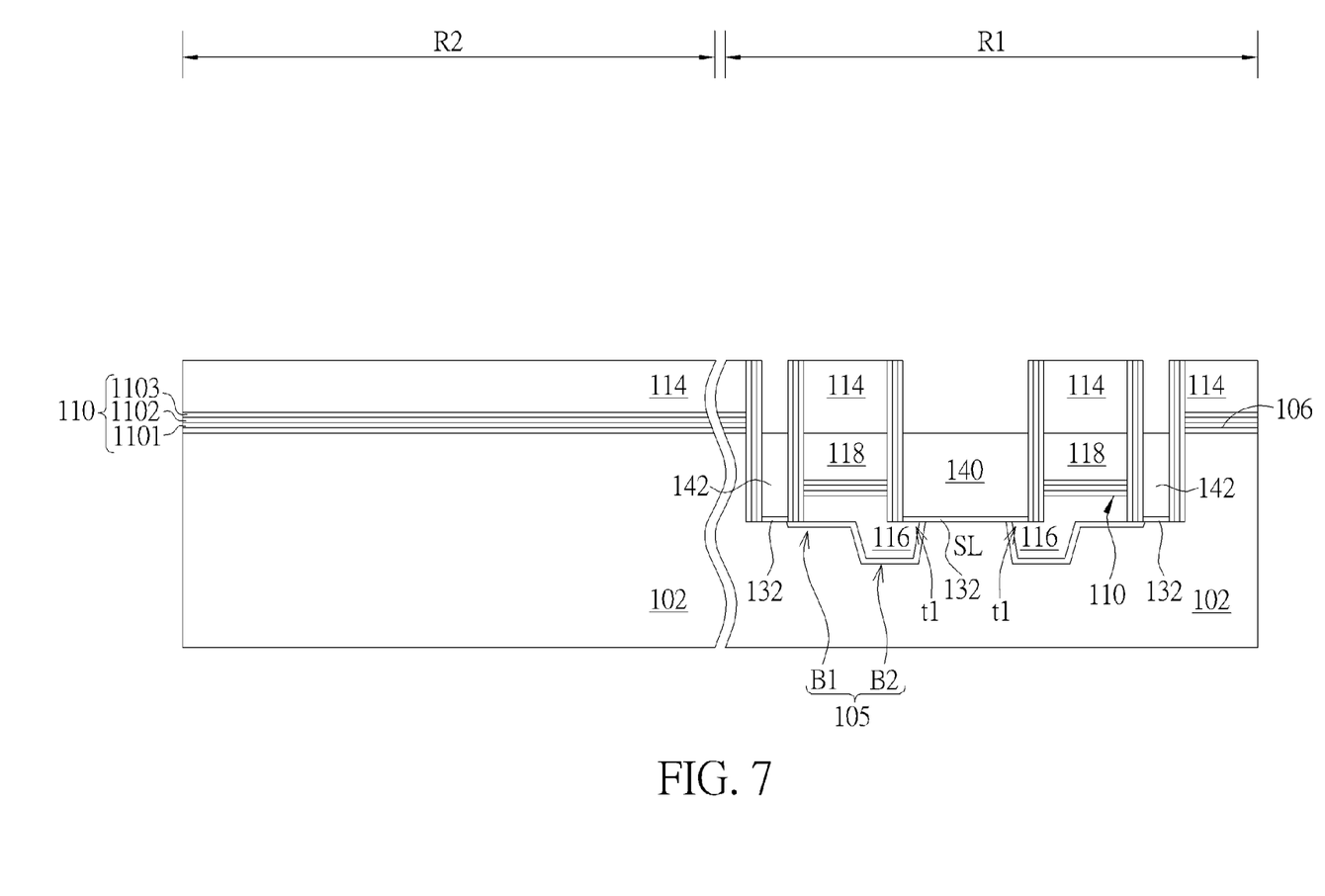

As shown in FIG. 7, an oxide layer 132 is formed in the bottom surface of the first trench 120 and in the second trenches 122 through a thermal anneal process (not shown). Next, a polysilicon layer is then filled in the first trench 120 and in the second trenches 122, and an etching back process is performed, so as to remove parts of the polysilicon layer. The remaining polysilicon layer in the first trench 120 forms an erase gate 140, and the remaining polysilicon layer in the second trenches 122 forms a plurality of word lines 142. It is noteworthy that the erase gate 140 is disposed between two floating gates 116, and since each floating gate gas a "Z" shape profile mentioned above, each floating gate 116 has a sharp corner (or a tip) t1 that is disposed under the erase gate 140 and directly contacts the oxide layer 132. In this way, while the erasing operation of the NVM is performed, the charges that stored in the floating gate 116 can be discharged easily through the sharp corner t1 to the erase gate 140, thereby improving the erasing efficiency (erase speed) of NVM.

Figure 8:
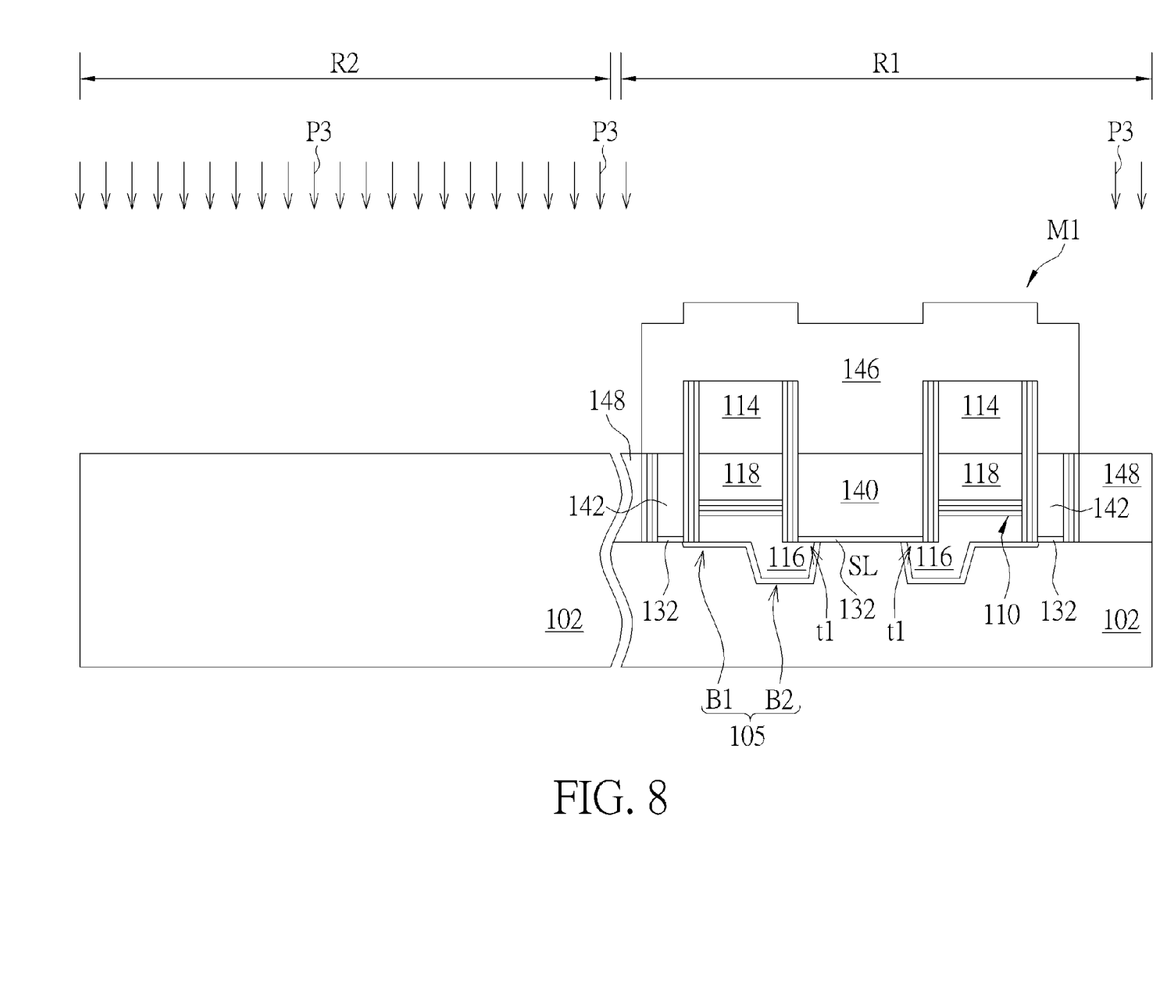

As shown in FIG. 8, a photoresist layer 146 is formed within the memory region R1, at least covering the non-volatile gate stack G1, and preferably further covers the erase gate 140 and the word lines 142. An etching process P3 is then performed, so as to remove the hard mask layer 114, the dielectric layer 110 and the tunnel layer 106 that is disposed out of the memory region R1. After the etching process P3 is performed, at least the surface of the substrate 102 within the logic region R2 will be exposed. At this step, a non-volatile memory (NVM) device M1 is completed, which at least includes the floating gates 116, the dielectric layer 110, the control gates 118 and the erase gate 140.

Figure 9:
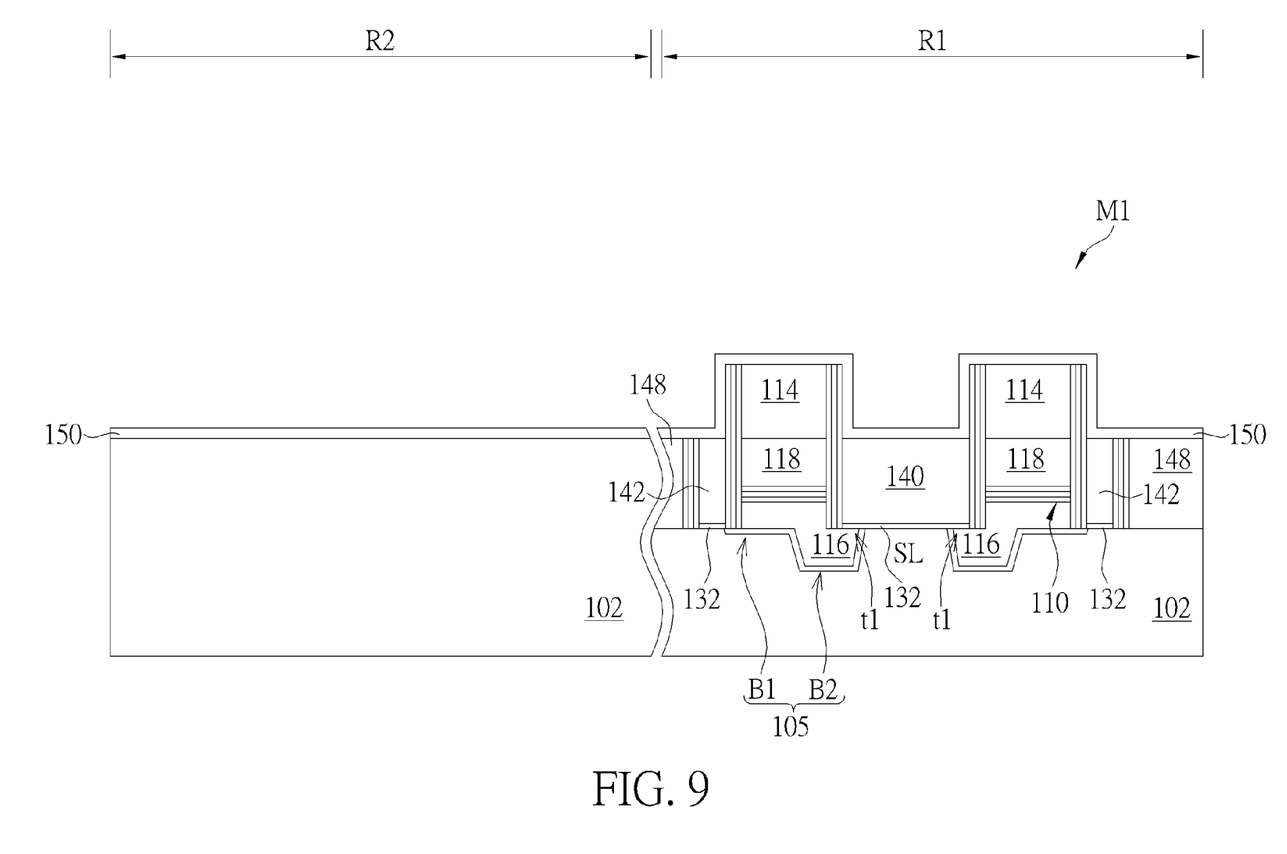

Next, some other processes such as forming the bit lines (not shown), forming the drain regions 148 surrounding the NVM device M1, and forming the well regions through an implant process can be performed. Those processes mentioned above are well known to those skilled in the art, and will not be described in detail here. Afterwards, as shown in FIG. 9, the photoresist layer 146 is removed, and a protective layer 150 such as an oxide layer 150 is formed and covering within the memory region R1, so as to protect the NVM device M1.

Figure 10:
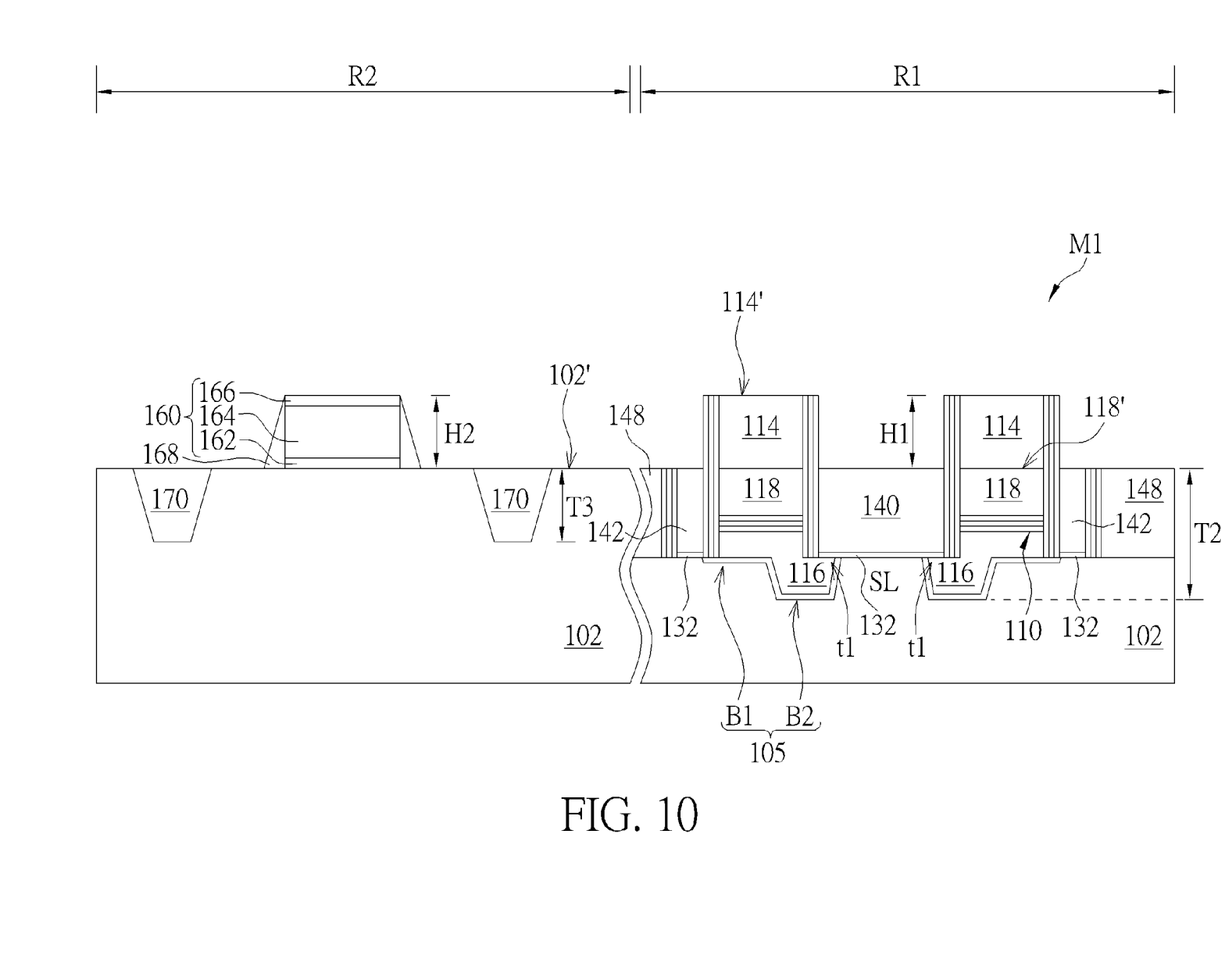

Thereafter, as shown in FIG. 10, some elements such as a logic gate stack 160 can be formed within the logic region R2. Besides, at least one shallow trench isolation (STI) 170 is also disposed within the logic region R2. Generally, the STI 170 is formed before the NVM device M1 is formed. In this embodiment, the logic gate stack 160 may include a gate dielectric layer 162, a gate conductive layer 164 and a cap layer 166 from bottom to top, and the material of the gate dielectric layer 162 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZrxTi_1$-$xO_3$, PZT), barium strontium titanate ($BaxSr_1$-$xTiO_3$, BST) or a combination thereof. The material of the gate conductive layer 164 may include undoped polysilicon, heavily doped polysilicon, or one or a plurality of metal layers such as a work function metal layer, a barrier layer and a low-resistance metal layer, etc. The cap layer 166 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. In addition, at least two spacers are further formed on two sidewalls of the logic gate stack 160, and the STI 170 is disposed in the substrate 102 within the logic region R2. In this embodiment, the depth T3 of each STI 170 is preferably shallower than the depth of the floating gate 116 (the vertical distance from the top surface of the substrate 102 to the second bottom B2 of the floating gate 116), but is not limited thereto.

The structures of the logic gate stack 160 and the NVM device M1 are shown in FIG. 10. Besides the features mentioned above, the logic gate stack 160 and the NVM device M1 of the present invention further comprising the following features:

(1) Each floating gate has a step-shaped bottom 105, and the step-shaped bottom 105 includes a first bottom surface B1 and a second bottom surface B2 lower than the first bottom surface B1. In addition, the floating gate has a "Z" shape profile, and has a sharp corner directly contacting the oxide layer 132 that is disposed under the erase gate 140.

(2) The hard mask layer 114 can be deemed as a cap layer disposed on each control gate 118, and a top surface 114' of the hard mask layer 114 is equal to or lower than a top surface of the logic gate stack 160. In this embodiment, the height H2 of the logic gate stack 160 is preferably equal to or lower than 700 angstroms, and the height H1 of the NVM device M1 is equal to or shorter than that of the logic gate stack 160. In other words, the height H1 of the NVM device M1 is also smaller than 700 angstroms.

(3) The NVM device M1 is partially embedded in the substrate 102, and the top surface of the control gate 118 is equal to or lower than a top surface 102' of the substrate 102. More precisely, in one case, a top surface 118' of the control gate 118 is lower than the top surface 102' of the substrate 102; in another case, the top surface 118' of the control gate 118 and the top surface 102' of the substrate 102 are on a same level.

In summary, the key feature of the present invention is that when forming the NVM device embedded in the substrate, and the height of the NVM device is equal to or lower than the height of the adjacent gate stack. In a conventional process, the height of the NVM device is much taller than the height of the adjacent gate stack, so the height of the total semiconductor device is thick. But in the present invention, since the NVM device is embedded in the substrate, the height of the total semiconductor device can be decreased. Another feature of the present invention is the floating gate of the NVM device has a step-shaped bottom and a "Z" shaped profile. Therefore, each floating gate has a sharp corner that is disposed under the erase gate and directly contacts the oxide layer of the erase gate. In this way, while the erasing operation of the NVM is performed, the charges that are stored in the floating gate can be discharged easily through the sharp corner to the erase gate, thereby improving the erasing efficiency (erase speed) of NVM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate with a memory region and a logic region, the substrate having a recess disposed in the memory region;
   a logic gate stack disposed in the logic region; and
   a non-volatile memory disposed in the recess, the non-volatile memory comprising at least two floating gates and at least two control gates disposed on the floating gates, wherein each floating gate has a step-shaped bottom and a flat top surface, wherein the flat top surface of each floating gate is not a step-shaped surface, and the step-shaped bottom includes a first bottom surface and a second bottom surface lower than the first bottom surface, in addition, each control gate disposed on the flat top surface of the floating gate, and each control gate has a flat bottom surface.

2. The semiconductor device according to claim 1, wherein the non-volatile memory includes an oxide-nitride-oxide (ONO) stack-layer between the control gate and the floating gate.

3. The semiconductor device according to claim 1, wherein a top surface of the control gate is lower than a top surface of the substrate.

4. The semiconductor device according to claim 1, wherein a top surface of the control gate and a top surface of the substrate are on a same level.

5. The semiconductor device according to claim 1, further comprising an erase gate, wherein the erase gate partially overlaps the two floating gate.

6. The semiconductor device according to claim 1, further comprising at least two cap layers disposed on each control gate, wherein a top surface of the cap layer is lower than a top surface of the logic gate stack.

7. The semiconductor device according to claim 6, wherein a vertical distance between a top surface of the substrate and the top surface of the cap layer is lower than 700 angstroms.

8. The semiconductor device according to claim 1, further comprising at least one shallow trench isolation (STI) disposed in the substrate.

9. The semiconductor device according to claim 8, wherein the step-shaped bottom of each floating gate is lower than a bottom surface of the STI.

10. The semiconductor device according to claim 1, wherein the floating gate is composed of a lower polysilicon layer.

* * * * *